United States Patent
Tsuchiya et al.

(10) Patent No.: US 9,650,544 B2
(45) Date of Patent: May 16, 2017

(54) POLISHING COMPOSITION, METHOD FOR MANUFACTURING POLISHING COMPOSITION, AND METHOD FOR MANUFACTURING POLISHING COMPOSITION LIQUID CONCENTRATE

(71) Applicant: FUJIMI INCORPORATED, Kiyosu-shi, Aichi (JP)

(72) Inventors: Kohsuke Tsuchiya, Kiyosu (JP); Maki Asada, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/422,631

(22) PCT Filed: Aug. 12, 2013

(86) PCT No.: PCT/JP2013/071822
§ 371 (c)(1),
(2) Date: Feb. 19, 2015

(87) PCT Pub. No.: WO2014/030570
PCT Pub. Date: Feb. 27, 2014

(65) Prior Publication Data
US 2015/0210891 A1    Jul. 30, 2015

(30) Foreign Application Priority Data

Aug. 23, 2012  (JP) ................................. 2012-184507

(51) Int. Cl.
C09G 1/02 (2006.01)
C09K 3/14 (2006.01)
H01L 21/02 (2006.01)

(52) U.S. Cl.
CPC .............. *C09G 1/02* (2013.01); *C09K 3/1409* (2013.01); *C09K 3/1436* (2013.01); *H01L 21/02024* (2013.01)

(58) Field of Classification Search
CPC .......... C09G 1/02; C09K 3/14; C09K 3/1409; C09K 3/1436; H01L 21/02024
See application file for complete search history.

(56) References Cited

U.S. PATENT DOCUMENTS

| | | | |
|---|---|---|---|
| 2006/0060974 A1 | 3/2006 | Hirano et al. | |
| 2007/0059935 A1* | 3/2007 | Kozasa | B24B 37/044 438/690 |
| 2009/0056231 A1 | 3/2009 | White et al. | |
| 2009/0239450 A1 | 9/2009 | Ishida et al. | |
| 2009/0253355 A1 | 10/2009 | Koyama et al. | |
| 2011/0081780 A1* | 4/2011 | Shida | C09G 1/02 438/693 |

FOREIGN PATENT DOCUMENTS

| | | | |
|---|---|---|---|
| CN | 1754935 A | 4/2006 | |
| CN | 101307211 A | 11/2008 | |
| CN | 101588895 A | 11/2009 | |
| JP | 2000-313815 A | 11/2000 | |
| JP | 2000313815 | * 11/2000 | ............ C08L 101/14 |
| JP | 2010-1334509 A | 2/2010 | |
| JP | 2010-538457 A | 12/2010 | |
| JP | 2011-061089 A | 3/2011 | |
| TW | 200717635 A | 5/2007 | |
| WO | WO 00/79577 A1 | 12/2000 | |
| WO | WO 2009/032065 A1 | 3/2009 | |
| WO | WO-2011/142362 A1 | 11/2011 | |

OTHER PUBLICATIONS

JP 2000313815 Machine Translation (2000) (11 Pages).*

* cited by examiner

*Primary Examiner* — Duy Deo
*Assistant Examiner* — Mahmoud Dahimene
(74) *Attorney, Agent, or Firm* — Foley & Lardner LLP

(57) ABSTRACT

A polishing composition contains silicon dioxide, a water-soluble polymer, and water. An adsorbate containing at least part of the water-soluble polymer is adsorbed on the silicon dioxide. The adsorbate is contained in a concentration of 4 ppm by mass or more in terms of carbon. A percentage of the concentration of the adsorbate in terms of carbon relative to a total carbon concentration in the polishing composition is 15% or more.

6 Claims, No Drawings

POLISHING COMPOSITION, METHOD FOR MANUFACTURING POLISHING COMPOSITION, AND METHOD FOR MANUFACTURING POLISHING COMPOSITION LIQUID CONCENTRATE

TECHNICAL FIELD

The present invention relates to a polishing composition, a method for producing the polishing composition, and a method for producing an undiluted polishing composition.

BACKGROUND ART

Movement to smaller design rules for semiconductor devices has been accelerated year by year in order to increase the integration degree and the operation speed of ULSIs (ultra large scale integration) or the like used in computers. Accordingly, there are an increased number of cases where nanoscale fine surface defects on a substrates used in a semiconductor device adversely affect the performance of the semiconductor device. Therefore, it has been increasingly of importance to control fine surface defects that have never been regarded as a problem.

Some fine surface defects occurring on a substrate result from foreign matter, such as polishing materials (e.g., abrasive grains), additives (e.g., water-soluble polymer), polishing pad debris, swarf generated from the substrate by polishing, or dust in air, that have been adsorbed on the substrate surface and failed to be removed in a cleaning step to remain on the substrate.

In order to reduce such surface defects due to foreign matter, it is effective to impart hydrophilicity to a substrate surface after polishing, thereby enhancing removal efficiency of foreign matter in a cleaning step. Patent Document 1, for example, discloses that a water-soluble polymer of which viscosity has been adjusted is used in a polishing composition for the purpose of imparting hydrophilicity to a substrate surface after polishing.

PRIOR ART DOCUMENT

Patent Document 1: Japanese Laid-Open Patent Publication No. 2010-34509

SUMMARY OF THE INVENTION

Problems that are to be Solved by the Invention

One objective of the present invention is to provide a polishing composition capable of easily suppressing fine surface defects occurring on a substrate and a method for producing the polishing composition. In addition, another objective of the present invention is to provide a method for producing an undiluted polishing composition for use in preparing the polishing composition.

Means for Solving the Problem

In order to achieve the above objectives and in accordance with one aspect of the present invention, a polishing composition is provided that contains silicon dioxide, a water-soluble polymer, and water, wherein an adsorbate containing at least part of the water-soluble polymer is adsorbed on the silicon dioxide, and wherein the adsorbate is contained in the polishing composition in a concentration of 4 ppm by mass or more in terms of carbon and the percentage of the concentration of the adsorbate in terms of carbon relative to the total carbon concentration in the polishing composition is 15% or more.

Preferably, the water-soluble polymer has a weight average molecular weight of 300,000 or less.

Preferably, the water-soluble polymer has a weight average molecular weight of 200,000 or less.

Preferably, the water-soluble polymer has a weight average molecular weight of 100,000 or less.

In accordance with another aspect of the present invention, a method for producing the polishing composition according to the aspect described above is provided that includes preparing an undiluted polishing composition containing silicon dioxide, a water-soluble polymer, and water; and diluting the undiluted polishing composition with water or a basic aqueous solution to obtain the polishing composition, in which an adsorbate containing the water-soluble polymer is adsorbed on the silicon dioxide, wherein the adsorbate is contained in the polishing composition in a concentration of 4 ppm by mass or more in terms of carbon and the percentage of the concentration of the adsorbate in terms of carbon relative to the total carbon concentration in the polishing composition is 15% or more.

Preferably, the preparing an undiluted polishing composition includes mixing a water-soluble polymer in a mixture of silicon dioxide and a basic compound and then filtering a resulting mixture.

Preferably, the undiluted polishing composition contains the silicon dioxide and the basic compound respectively in an amount of 1% by mass or more and 20% by mass or less and in an amount of 0.01% by mass or more and 1% by mass or less.

Preferably, the amount by mole of the basic compound per unit surface area of the silicon dioxide is $8.5 \times 10^{-6}$ mol/m$^2$ or more in the undiluted polishing composition.

In accordance with still another aspect of the present invention, a method for producing an undiluted polishing composition is provided that includes mixing a water-soluble polymer in a mixture of silicon dioxide and a basic compound and then filtering a resulting mixture.

Preferably, the undiluted polishing composition contains the silicon dioxide and the basic compound respectively in an amount of 1% by mass or more and 20% by mass or less and in an amount of 0.01% by mass or more and 1% by mass or less.

Preferably, the amount by mole of the basic compound per unit surface area of the silicon dioxide is $8.5 \times 10^{-6}$ mol/m$^2$ or more in the undiluted polishing composition.

Effects of the Invention

The polishing composition of the present invention succeeds in easily suppressing fine surface defects occurring on a substrate. The method for producing a polishing composition of the present invention succeeds in obtaining a polishing composition easily suppressing fine surface defects occurring on a substrate. The method for producing an undiluted polishing composition of the present invention succeeds in obtaining an undiluted polishing composition for use in preparing a polishing composition easily suppressing fine surface defects occurring on a substrate.

MODES FOR CARRYING OUT THE INVENTION

One embodiment of the present invention will now be described.

A polishing composition according to the present embodiment contains at least silicon dioxide, a water-soluble polymer, and water. The polishing composition of the present embodiment is used for polishing a semiconductor substrate, such as a silicon substrate.

The water in the polishing composition functions as a dispersion medium or a solvent for other ingredients. It is preferred that water does not inhibit functions of other ingredients contained in the polishing composition. Examples of such water include water having a total content of transition metal ions of 100 ppb or less. The purity of water can be enhanced by a procedure, for example, removal of impurity ions using an ion exchange resin, removal of particles with a filter, or distillation. Specifically, it is preferred to use, for example, ion-exchange water, pure water, super-pure water, or distilled water.

The silicon dioxide in the polishing composition has a function as abrasive grains to mechanically polish an object to be polished. In addition, the silicon dioxide also serves as carriers to deliver the water-soluble polymer to the surface of the object to be polished.

Examples of the silicon dioxide used include colloidal silica, fumed silica, and sol-gel-derived silica. Colloidal silica or fumed silica, particularly colloidal silica, is preferred since use thereof results in reduction of scratches occurring on a substrate surface through polishing. One of such silicon dioxides may be used alone or two or more thereof may be used in combination.

The average primary particle diameter of the silicon dioxide is preferably 5 nm or more, and more preferably 10 nm or more. As the average primary particle diameter of the silicon dioxide increases, the polishing efficiency is enhanced. The average primary particle diameter of the silicon dioxide is also preferably 100 nm or less, and more preferably 40 nm or less. As the average primary particle diameter of the silicon dioxide decreases, the roughness of a substrate surface after polishing is improved. The average primary particle diameter of the silicon dioxide can be determined based on the specific surface area thereof measured by the BET method.

The silicon dioxide preferably has a particle size distribution giving a value (D90/D10) of 1 or more and 4 or less, which is obtained by dividing the volume-based 90% cumulative mean diameter (D90) by the volume-based 10% cumulative mean diameter (D10). The volume-based 10% cumulative mean diameter (D10) and 90% cumulative mean diameter (D90) refer to the mean secondary particle diameters of particles the volumes of which are added up when the particle volumes are added up in ascending order of the particle diameter until the added up volume reaches 10% and 90%, respectively, of the total volume of all the particles. The silicon dioxide having such a particle size distribution results in a tendency where the quality of the substrate surface after polishing is homogeneous. The particle size distribution of the silicon dioxide can be determined by, for example, using a particle size distribution measuring apparatus based on the dynamic light scattering method.

The content of the silicon dioxide in the polishing composition is preferably 0.01% by mass or more. As the content of the silicon dioxide increases, a high polishing rate is easily obtained and high hydrophilicity is imparted to a substrate surface. The content of the silicon dioxide in the polishing composition is also preferably 5% by mass or less, more preferably 1% by mass or less, and still more preferably 0.5% by mass or less. As the content of the silicon dioxide decreases, the dispersion stability of the silicon dioxide is improved and the residue of the silicon dioxide is less likely to be adsorbed on a substrate surface after polishing.

The water-soluble polymer in the polishing composition is adsorbed on a substrate surface after polishing, thereby functioning to enhance the wettability of the substrate surface. Examples of the water-soluble polymer include a cellulose derivative, polyvinylpyrrolidone, and a copolymer containing polyvinylpyrrolidone. Examples of the cellulose derivative include hydroxyethyl cellulose and hydrolyzed hydroxyethyl cellulose. Examples of the copolymer containing polyvinylpyrrolidone include a graft polymer of polyvinyl alcohol and polyvinylpyrrolidone. One of the water-soluble polymers may be used alone or two or more thereof may be used in combination.

The weight average molecular weight of the water-soluble polymer is preferably 10,000 or more, more preferably 30,000 or more, and still more preferably 50,000 or more in terms of polyethylene oxide. As the weight average molecular weight of the water-soluble polymer increases, high hydrophilicity is imparted to a substrate surface. The weight average molecular weight of the water-soluble polymer is also preferably 1,000,000 or less, more preferably 300,000 or less, still more preferably 200,000 or less, and most preferably 100,000 or less. As the weight average molecular weight of the water-soluble polymer decreases, the water-soluble polymer attached to a substrate surface is easily removed by cleaning. In addition, the dispersion stability of the water-soluble polymer is improved and the residue of the water-soluble polymer is less likely to be adsorbed on a substrate surface after polishing.

The content of the water-soluble polymer in the polishing composition is preferably 0.0001% by mass or more, and more preferably 0.001% by mass or more. As the content of the water-soluble polymer increases, high hydrophilicity is imparted to a substrate surface. The content of the water-soluble polymer in the polishing composition is also preferably 0.5% by mass or less, and more preferably 0.1% by mass or less. As the content of the water-soluble polymer decreases, the dispersion stability of the water-soluble polymer is improved and the residue of the water-soluble polymer is less likely to be adsorbed on a substrate surface after polishing.

The polishing composition of the present embodiment may contain any other ingredient than silicon dioxide, a water-soluble polymer, and water as needed. Even when any other ingredient is included, however, the polishing composition preferably contains a water-soluble polymer in a high concentration in terms of carbon. Specifically, the percentage of the concentration of the water-soluble polymer in terms of carbon relative to the total carbon concentration in the polishing composition is preferably 50% or more, more preferably 70% or more, and still more preferably 85% or more.

Examples of the other ingredients include known additives commonly contained in polishing compositions, for example, a basic compound, a surfactant, a salt, an antiseptic agent, an antifungal agent, and a chelating agent.

A basic composition has a function to chemically polish (chemical etching) a substrate surface. Therefore, when the polishing composition contains a basic compound, the rate of polishing a substrate is easily enhanced.

Specific examples of basic compounds include hydroxides or salts of alkali metals, quaternary ammonium hydroxides or salts thereof, ammonia, and amines. Specific examples of the alkali metals include potassium and sodium. Specific examples of the salts include carbonates, bicarbonates, sulfates, and acetates. Specific examples of the quaternary ammoniums include tetramethylammonium, tetraethylammonium, and tetrabutylammonium. Specific examples of the hydroxides or salts of alkali metal include potassium hydroxide, potassium carbonate, potassium bicarbonate, potassium sulfate, potassium acetate, and potassium chloride. Specific examples of the quaternary ammonium hydroxides or salts thereof include tetramethylammonium hydroxide, tetraethylammonium hydroxide, and tetrabutylammonium hydroxide. Specific examples of the amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methyl piperazine, and guanidine. One of such basic compounds may be used alone or two or more thereof may be used in combination.

Among basic compounds, at least one selected from ammonia, ammonium salts, alkali metal hydroxides, alkali metal salts, and quaternary ammonium hydroxides is preferred. Among basic compounds, at least one selected from ammonia, potassium hydroxide, sodium hydroxide, tetramethylammonium hydroxide, tetraethylammonium hydroxide, ammonium bicarbonate, ammonium carbonate, potassium bicarbonate, potassium carbonate, sodium bicarbonate, and sodium carbonate is more preferred, at least one selected from ammonia, potassium hydroxide, sodium hydroxide, tetramethylammonium hydroxide, and tetraethylammonium hydroxide is further preferred, at least one of ammonia and tetramethylammonium hydroxide is still more preferred, and ammonia is most preferred.

The content of the basic compound in the polishing composition is preferably 0.0001% by mass or more, and more preferably 0.001% by mass or more. As the content of the basic compound in the polishing composition increases, a high polishing rate is obtained. The content of the basic compound in the polishing composition is also preferably 0.5% by mass or less, and more preferably 0.25% by mass or less. As the content of the basic compound in the polishing composition decreases, the water-soluble polymer is easily adsorbed on a substrate surface, thereby imparting high hydrophilicity to the substrate surface. In addition, there is also a tendency where the haze level of a substrate surface after polishing is reduced.

The surfactant optionally contained in the polishing composition has a function to suppress roughening of a substrate surface. Therefore, when the polishing composition contains a surfactant, the haze level of a substrate surface after polishing is easily reduced. Particularly, when the polishing composition contains a basic compound, a substrate surface after polishing is likely to be roughened due to the chemical etching with the basic compound. Accordingly, use of a basic compound and a surfactant in combination is particularly effective.

The surfactant may be either anionic or nonionic, and among others, a nonionic surfactant is preferable. A nonionic surfactant leads to easy handling of the polishing composition during preparation and use thereof due to low foaming. In addition, when a nonionic surfactant is used, the pH of the polishing composition is easily adjusted. Further, a nonionic surfactant is excellent in biodegradability and has low toxicity to an organism. Thus, there are advantages including a small environmental influence and little concern in handling thereof.

Specific examples of surfactants include oxyalkylene monopolymers, such as polyethylene glycol and polypropylene glycol; oxyalkylene copolymers, such as diblock-type, triblock-type, random-type, and alternating-type copolymers of polyoxyethylene polyoxypropylene; and polyoxyalkylene adducts, such as polyoxyethylene alkyl ethers, polyoxyethylene alkyl phenyl ethers, polyoxyethylene alkylamines, polyoxyethylene fatty acid esters, polyoxyethylene glyceryl ether fatty acid esters, and polyoxyethylene sorbitan fatty acid esters. More specific examples thereof include polyoxyethylene polyoxypropylene copolymer, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene lauryl amine, polyoxyethylene stearyl amine, polyoxyethylene oleyl amine, polyoxyethylene stearyl amide, polyoxyethylene oleyl amide, polyoxyethylene monolaurate ester, polyoxyethylene monostearate ester, polyoxyethylene distearate ester, polyoxyethylene monooleate ester, polyoxyethylene dioleate ester, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbitan tetraoleate, polyoxyethylene sorbitol tetraoleate, polyoxyethylene castor oil, and polyoxyethylene hydrogenated castor oil. One of the surfactants may be used alone or two or more thereof may be used in combination.

The weight average molecular weight of the surfactant is preferably 200 or more, and more preferably 300 or more. The weight average molecular weight of the surfactant is also preferably less than 10,000. The weight average molecular weight of the surfactant in the range described above leads to suppression of the roughening occurring on a substrate surface.

The content of the surfactant in the polishing composition is preferably 0.00001% by mass or more, and more preferably 0.00005% by mass or more. As the content of the surfactant increases, the roughening occurring on a substrate surface is suppressed. The content of the surfactant in the polishing composition is also preferably 0.1% by mass or less, and more preferably 0.05% by mass or less. As the content of the surfactant decreases, the polishing efficiency is enhanced.

The salt optionally contained in the polishing composition has a function to enhance the hydrophilicity of a substrate surface through an interaction with the water-soluble polymer. The salt may be either an organic acid salt or an inorganic acid salt. The organic acid salt and the inorganic acid salt used are not limited with regard to the kind, structure, and ion valence of acid, and the basic species to form the salt. Examples of the acidic species of the organic acid salt and the inorganic acid salt include fatty acids, such as formic acid, acetic acid, and propionic acid; aromatic carboxylic acids, such as benzoic acid and phthalic acid; citric acid; oxalic acid; tartaric acid; malic acid; maleic acid; fumaric acid; succinic acid; organic sulfonic acids; organic phosphonic acids; carbonic acid; nitric acid; and sulfuric acid. Examples of the basic species to form the organic acid salt and the inorganic acid salt include ammonium ion and metal ions. Among such basic species, ammonium ion is particularly preferred in terms of reduction of metallic contamination of a substrate. One of such salts may be used alone or two or more thereof may be used in combination.

The pH of the polishing composition is preferably 8.0 or more, and more preferably 9.0 or more. The pH of the polishing composition is also preferably 12.0 or less, and more preferably 11.0 or less. When the pH of the polishing composition is adjusted in the range described above, a particularly preferable polishing rate in the practical use is easily obtained.

In the polishing composition, an adsorbate containing at least the water-soluble polymer is adsorbed on the surface of the silicon dioxide. The adsorbate is contained in the polishing composition in a concentration of 4 ppm by mass or more, and preferably 10 ppm by mass or more, in terms of carbon. The percentage of the concentration of the adsorbate in terms of carbon relative to the total carbon concentration in the polishing composition is 15% or more, and preferably 30% or more. High hydrophilicity is imparted to a substrate surface by setting the concentration of the adsorbate in terms of carbon and the percentage of the concentration of the adsorbate in terms of carbon relative to the total carbon concentration in the polishing composition in the ranges described above, respectively. The concentration of the adsorbate in terms of carbon and the percentage of the concentration of the adsorbate in terms of carbon relative to the total carbon concentration in the polishing composition can be adjusted by, for example, changing the combination of the kinds of the silicon dioxide and the water-soluble polymer used or changing the ratio of the content of the water-soluble polymer relative to the content of the silicon dioxide in the polishing composition.

The action of the polishing composition according to the present embodiment will be described below.

It has been known that hydrophilicity is imparted to the surface of a substrate surface by polishing the substrate using a polishing composition including a water-soluble polymer. The present inventors have found as a result of intensive studies that when a substrate is polished using a polishing composition containing silicon dioxide and a water-soluble polymer, the hydrophilicity imparted to the substrate surface correlates to the absolute amount of an adsorbate containing the water-soluble polymer adsorbed on the silicon dioxide and the relative amount of the adsorbate in the polishing composition. Then, it has been found that the effect for imparting hydrophilicity to a substrate surface is significantly enhanced by making the concentration of the adsorbate in the polishing composition 4 ppm by mass or more in terms of carbon and making the percentage of the concentration of the adsorbate in terms of carbon relative to the total amount of carbon in the polishing composition 15% or more.

Impartment of hydrophilicity to a substrate surface with a water-soluble polymer is caused by adsorption of the water-soluble polymer on the substrate surface. In order to allow the substrate surface to adsorb the water-soluble polymer, it is important to allow the silicon dioxide to function as carriers. That is, when the surface of a silicon dioxide is in a state of adsorbing a water-soluble polymer in a polishing composition, the water-soluble polymer adsorbed on the surface of the silicon dioxide transfers to a substrate surface upon rubbing of the silicon dioxide and the substrate surface against each other during polishing. This can allow the substrate surface to efficiently adsorb the water-soluble polymer, thereby effectively enhancing the hydrophilicity of the substrate surface. Consequently, fine surface defects occurring on the substrate are easily suppressed. Upon the adsorption of a water-soluble polymer on a substrate surface, a hydrophobic bond is believed to be formed between the substrate and the carbon in the water-soluble polymer.

The method for producing the polishing composition according to the present embodiment will be described below.

The method for producing the polishing composition includes an undiluted composition preparing step of preparing an undiluted polishing composition containing silicon dioxide, a water-soluble polymer, and water; and a diluting step of diluting the undiluted polishing composition.

[Undiluted Composition Preparing Step]

In the undiluted composition preparing step, first of all, a first mixed liquid containing silicon dioxide and water is prepared. Preferably, silicon dioxide is filtered prior to mixing with water. The pH of the first mixed liquid is preferably 8 or more, and more preferably 9 or more. As the pH of the first mixed liquid increases, adsorption of a water-soluble polymer on the silicon dioxide is suppressed upon the subsequent mixing of the first mixed liquid with the water-soluble polymer and aggregation of the water-soluble polymer (gelated matter) is suppressed. The pH of the first mixed liquid is preferably 12 or less, and more preferably 10.5 or less. As the pH of the first mixed liquid decreases, dissolution of the silicon dioxide is suppressed. The pH of the first mixed liquid can be adjusted by addition of a basic compound.

Additionally, in the undiluted composition preparing step, a second mixed liquid containing a water-soluble polymer and water is prepared. Preferably, a water-soluble polymer is filtered prior to mixing with water. The pH of the second mixed liquid is preferably adjusted to be nearly neutral to nearly basic, and more preferably basic.

The pH of the second mixed liquid is preferably 7 or more, more preferably 8 or more, and still more preferably 9 or more. As the pH thereof increases, aggregation of the silicon dioxide is suppressed upon mixing the first mixed liquid and the second mixed liquid, thereby improving the dispersion stability of the undiluted polishing composition and the polishing composition. The pH of the second mixed liquid is preferably 12 or less, and more preferably 10.5 or less. As the pH of the second mixed liquid decreases, dissolution of the silicon dioxide is suppressed. The pH of the second mixed liquid can be adjusted by addition of a basic compound.

Then, a third mixed liquid is prepared by mixing the first mixed liquid and the second mixed liquid. The method for mixing the first mixed liquid and the second mixed liquid is not particularly limited but it is preferred to pour the second mixed liquid into the first mixed liquid and mix them. In this case, the pouring rate of the second mixed liquid is preferably 0.1 mL/min or more, more preferably 1 mL/min or more, and still more preferably 5 mL/min or more, per liter of the first mixed liquid. As the pouring rate increases, the production efficiency of the undiluted polishing composition is enhanced. The pouring rate of the second mixed liquid is also preferably 500 mL/min or less, more preferably 100 mL/min or less, and still more preferably 50 mL/min or less, per liter of the first mixed liquid. As the pouring rate decreases, aggregation of the silicon dioxide is suppressed.

It is preferred to filter the second mixed liquid prior to mixing with the first mixed liquid. By the filtration, foreign matter or aggregates contained in the second mixed liquid can be removed. The filtration of the second mixed liquid may be natural filtration performed in a state of normal pressure, or alternatively, may be carried out as filtration under reduced pressure, pressure filtration, or centrifugal filtration. Preferably, the filter used in the filtration is selected based on an aperture. As the aperture of the filter, the nominal value, such as a catalog value of a manufacturer, can be usually employed.

The aperture of the filter used in the filtration of the second mixed liquid is preferably 0.05 µm or more, more preferably 0.1 µm or more, and still more preferably 0.2 µm or more. As the aperture of the filter increases, the production efficiency is enhanced. The aperture of the filter is also preferably 50 µm or less, more preferably 30 µm or less, still more preferably 10 µm or less, yet more preferably 1 µm or less, and most preferably 0.45 µm or less. As the aperture of the filter decreases, the removal efficiency of foreign matter or aggregates contained in the second mixed liquid is enhanced, thereby easily improving the dispersion stability of the undiluted polishing composition and the polishing composition.

In addition, in the undiluted composition preparing step, the third mixed liquid is filtered with a filter. Then, the undiluted polishing composition is obtained through the filtration. The aperture of the filter used in the filtration of the third mixed liquid is preferably 1 µm or less, more preferably 0.45 µm or less, and still more preferably 0.2 µm or less from the viewpoint of removing fine foreign matter. The material and the structure of the filter used in the filtration of the third mixed liquid are not particularly limited. Examples of the filter material include cellulose, nylon, polysulfone, polyethersulfone, polypropylene, polytetrafluoroethylene (PTFE), polycarbonate, and glass. Examples of the filter structure include a depth filter, a pleated filter, and a membrane filter.

The content of the silicon dioxide in the undiluted polishing composition is preferably 1% by mass or more. As the content of the silicon dioxide increases, i.e., as the concentration rate of the undiluted polishing composition increases, the undiluted polishing composition is advantageously handled upon transportation and the like since a large amount of the polishing composition can be prepared from a small amount of the undiluted polishing composition. The content of the silicon dioxide in the undiluted polishing composition is also preferably 20% by mass or less, and more preferably 15% by mass or less. As the content of the silicon dioxide decreases, aggregation is less likely to occur during the preparation of the undiluted polishing composition.

The content of the basic compound in the undiluted polishing composition is preferably 0.01% by mass or more, and more preferably 0.05% by mass or more. As the content of the basic compound increases, aggregation is less likely to occur during the preparation of the undiluted polishing composition. The content of the basic compound in the undiluted polishing composition is also preferably 1% by mass or less, more preferably 0.75% by mass or less, and still more preferably 0.40% by mass or less. As the content of the basic compound decreases, a polishing composition capable of imparting high hydrophilicity to a substrate surface is easily obtained.

In the undiluted polishing composition, the amount by mole of the basic compound per unit surface area of the silicon dioxide is preferably $8.5 \times 10^{-6}$ mol/m$^2$ or more, and more preferably $10 \times 10^{-6}$ mol/m$^2$ or more. As the amount by mole of the basic compound increases, aggregation is less likely to occur during the preparation of the undiluted polishing composition. The amount by mole of the basic compound per unit surface area of the silicon dioxide is also preferably $120 \times 10^{-6}$ mol/m$^2$ or less, more preferably $80 \times 10^{-6}$ mol/m$^2$ or less, and still more preferably $40 \times 10^{-6}$ mol/m$^2$ or less. As the amount by mole of the basic compound decreases, a polishing composition capable of imparting high hydrophilicity to a substrate surface is easily obtained.

[Diluting Step]

In the diluting step, the undiluted polishing composition is diluted with water or a basic aqueous solution to prepare the polishing composition. During the diluting step, the state where a water-soluble polymer is adsorbed on the surface of silicon dioxide is created.

The pH of the basic aqueous solution is preferably 8 or more, and more preferably 9 or more. As the pH thereof increases, aggregation of the silicon dioxide is suppressed upon the dilution, thereby improving the dispersion stability of the polishing composition. The pH of the basic aqueous solution is also preferably 12 or less, and more preferably 10.5 or less. As the pH of the basic aqueous solution decreases, dissolution of the silicon dioxide is suppressed. The pH of the basic aqueous solution can be adjusted by addition of a basic compound.

In the diluting step, the dilution rate for the undiluted polishing composition is 10 times or more and 100 times or less, and more preferably 20 times or more and 60 times or less. The water-soluble polymer is adsorbed on the silicon dioxide in a suitable manner by setting the dilution rate for the undiluted polishing composition in the range described above.

An example of a polishing method using the polishing composition according to the present embodiment will be described below.

When the surface of a silicon substrate is polished using the polishing composition according to the present embodiment, the silicon substrate and a polishing pad that is pressed against the surface of the silicon substrate are rotated while the polishing composition being supplied to the surface of the silicon substrate. This allows the surface of the silicon substrate to be polished by a physical action due to the friction between the polishing pad and the surface of the silicon substrate. The surface of the silicon substrate is also polished by a physical action due to the friction between the silicon dioxide and the surface of the silicon substrate. At the same time, the water-soluble polymer adsorbed on the silicon dioxide transfers to the surface of the silicon substrate, thereby imparting hydrophilicity to the surface of the silicon substrate. When the polishing composition contains a basic compound, the surface of the silicon substrate is also polished by a chemical action due to the basic compound in addition to the physical functions described above.

According to the embodiment described above in details, the following effects are exhibited:

(1) The polishing composition contains silicon dioxide, a water-soluble polymer, and water. An adsorbate containing the water-soluble polymer is adsorbed on the silicon dioxide. The concentration of the adsorbate in the polishing composition is 4 ppm by mass or more in terms of carbon and the percentage of the concentration of the adsorbate in terms of carbon relative to the total carbon concentration in the polishing composition is 15% or more. The polishing composition enhances the hydrophilicity of a substrate surface after polishing. Consequently, the cleanliness of the substrate surface is improved, thereby easily reducing nanoscale fine surface defects caused by foreign matter adsorbed on the substrate surface.

(2) When the weight average molecular weight of the water-soluble polymer is 300,000 or less, or more specifically 200,000 or less or 100,000 or less, the water-soluble polymer attached to the substrate surface is further easily removed by cleaning.

(3) The method for producing the polishing composition includes an undiluted composition preparing step of preparing an undiluted polishing composition containing silicon dioxide, a water-soluble polymer, and water; and a step of diluting the undiluted polishing composition with water or a basic aqueous solution to obtain the polishing composition, in which an adsorbate containing the water-soluble polymer is adsorbed on the silicon dioxide, wherein the concentration of the adsorbate in the polishing composition is 4 ppm by mass or more in terms of carbon and the percentage of the concentration of the adsorbate in terms of carbon relative to the total carbon concentration in the polishing composition is 15% or more. This gives the polishing composition that improves the hydrophilicity of a substrate surface after polishing, thereby easily reducing nanoscale fine surface defects caused by foreign matter adsorbed on the substrate surface. In addition, since the undiluted polishing composition, which has high concentrations of the silicon dioxide and the water-soluble polymer, is excellent in dispersion stability, filtration with high accuracy is easily achieved by preparing the undiluted polishing composition and performing filtration treatment in the state of the undiluted polishing composition. Furthermore, when storage and transportation are carried out in the state of the undiluted polishing composition and the polishing composition is prepared by diluting the undiluted composition with water in use, storage and transportation in a container of a small capacity are possible, thereby making handling thereof easy.

(4) When the undiluted composition preparing step includes mixing a water-soluble polymer in a mixture of silicon dioxide and a basic compound and then filtering a resulting mixture, adsorption of the water-soluble polymer on the silicon dioxide is suppressed upon preparation of the undiluted composition and aggregation of the water-soluble polymer (gelated matter) is suppressed. Consequently, the polishing composition obtained from the undiluted polishing composition is that capable of easily reducing nanoscale fine surface defects caused by foreign matter adsorbed on a substrate surface.

(5) When the content of the silicon dioxide is 1% or more and 20% by mass or less and the content of the basic compound is 0.01% by mass or more and 1% by mass or less in the undiluted polishing composition, the undiluted polishing composition having a good dispersion state is obtained.

(6) When the amount by mole of the basic compound per unit surface area of the silicon dioxide is $8.5 \times 10^{-6}$ mol/m$^2$ or more in the undiluted polishing composition, the undiluted polishing composition having a good dispersion state is obtained.

The embodiment described above may be modified as follows:

The polishing composition according to the embodiment may be of one-component type or multi-component type such as two-component type.

Each ingredient contained in the polishing composition according to the embodiment may be filtered with a filter immediately before the preparation. The polishing composition according to the embodiment may be filtered with a filter immediately before the use. The filtration removes large foreign matter in the polishing composition to improve the quality thereof.

The polishing composition according to the embodiment may be sold in the state of the undiluted polishing composition and the polishing composition may be prepared by diluting the undiluted polishing composition with water or a basic aqueous solution when used.

In the method for producing the polishing composition, the timing of mixing therein ingredients such as a surfactant and a salt is not particularly limited. For example, such ingredients may be mixed during preparation of the first mixed liquid or the second mixed liquid, or during preparation of the third mixed liquid. Preferably, such ingredients are filtered prior to mixing thereof.

Although, in the method for producing the polishing composition according to the embodiment, the second mixed liquid including a water-soluble polymer is mixed in the first mixed liquid upon preparation of the undiluted polishing composition, a water-soluble polymer and water may be separately mixed in the first mixed liquid or a water-soluble polymer only may be mixed in the first mixed liquid.

The polishing pad used in the polishing step using the polishing composition according to the embodiment is not particularly limited. For example, any of polishing pads of nonwoven cloth type, suede type, and those containing abrasive grains or not containing abrasive grains may be used.

Upon polishing a silicon substrate using the polishing composition according to the embodiment, the polishing composition having been used once for polishing may be collected and reused for polishing the silicon substrate. The method for reusing the polishing composition includes, for example, that in which the used polishing composition having been discharged from the polishing apparatus is once collected in a tank and then used by recycling the polishing composition into the polishing apparatus from the tank. Reuse of the polishing composition reduces the amount of the polishing composition treated as a waste, as well as the quantity consumed of the polishing composition. This is useful with respect to capability of reducing the impact on the environment and reducing the cost for polishing silicon substrates.

When the polishing composition is reused, ingredients such as silicon dioxide and a water-soluble polymer are consumed and lost by polishing. Thus, it is preferred to supplement ingredients such as silicon dioxide and a water-soluble polymer with the amounts corresponding to losses thereof to the polishing composition. The ingredients to be supplemented may be individually added to the polishing composition, or alternatively, added as a mixture containing two or more ingredients in any concentrations to the polishing composition depending on, for example, the tank capacity and polishing conditions. By supplementing the ingredients in the amount corresponding to losses thereof to the polishing composition to be reused, the composition of the polishing composition is retained so that the polishing composition can sustainably exert functions thereof.

The polishing composition according to the embodiment may be used in applications other than that for polishing of a silicon substrate. For example, the polishing composition may be used to obtain a polished product composed of a metal such as stainless steel, a plastic, glass, or sapphire.

The effects described in (4) to (6) are not those obtained only in the production of the polishing composition according to the embodiment but those which can be obtained in the production of any polishing compositions containing silicon dioxide, a water-soluble polymer, a basic compound, and water or undiluted polishing compositions for obtaining the polishing compositions. That is, the method including mixing a water-soluble polymer in a mixture of silicon dioxide and a basic compound and then filtering a resulting mixture may be employed as a method for producing an undiluted polishing composition for obtaining a polishing composition containing silicon dioxide, a water-soluble polymer, a basic compound, and water. Also in this case, adsorption of the water-soluble polymer on the silicon dioxide is suppressed upon preparation of the undiluted composition and aggregation of the water-soluble polymer (gelated matter) is suppressed. Consequently, the polishing composition obtained from the undiluted polishing composition prepared is that capable of easily reducing nanoscale fine surface defects caused by foreign matter adsorbed on a substrate surface.

The following are technical ideas that can be understood from the embodiment mentioned above:

(a) A polishing composition comprising silicon dioxide, a water-soluble polymer, and water, wherein part of the water-soluble polymer is adsorbed on the silicon dioxide, and the concentration of the water-soluble polymer adsorbed on the silicon dioxide is 4 ppm by mass or more in terms of carbon and the percentage of the concentration of the water-soluble polymer adsorbed on the silicon dioxide in terms of carbon relative to the total concentration of all the water-soluble polymer in the polishing composition in terms of carbon is 15% or more.

(b) A method for producing a polishing composition, comprising diluting an undiluted polishing composition containing silicon dioxide, a water-soluble polymer, and water with water or a basic aqueous solution, wherein the concentration of the water-soluble polymer adsorbed on the silicon dioxide is 4 ppm by mass or more in terms of carbon and the percentage of the concentration of the water-soluble polymer adsorbed on the silicon dioxide in terms of carbon relative to the total concentration of all the water-soluble polymer in the polishing composition in terms of carbon is 15% or more.

Examples

Next, the embodiment described above will be more specifically illustrated with reference to examples and comparative examples.

In each of Examples 1 to 13 and Comparative Examples 2 to 8, a first mixed liquid in which silicon dioxide, a basic compound, and ion-exchange water were mixed and a second mixed liquid in which a water-soluble polymer and ion-exchange water were mixed were prepared and the second mixed liquid was mixed in the first mixed liquid to prepare a third mixed liquid. In each of Examples 14 to 17, a first mixed liquid in which silicon dioxide, a basic compound, and ion-exchange water were mixed and a second mixed liquid in which a water-soluble polymer, a surfactant, a salt, and ion-exchange water were mixed were prepared and the second mixed liquid was mixed in the first mixed liquid to prepare a third mixed liquid. In Comparative Example 1, a water-soluble polymer was mixed in a first mixed liquid in which a basic compound and ion-exchange water were mixed to prepare a third mixed liquid. Then, each resulting third mixed liquid was filtered with a filter having an aperture of 0.45 μm to prepare an undiluted polishing composition. Each resulting undiluted polishing composition was diluted to 20 times with ion-exchange water (to 40 times for only Example 10) to prepare a polishing composition.

In Comparative Example 9, a first mixed liquid in which silicon dioxide and ion-exchange water were mixed and a second mixed liquid in which a water-soluble polymer and ion-exchange water were mixed were prepared and the second mixed liquid was mixed in the first mixed liquid to prepare a third mixed liquid. In Comparative Example 10, a first mixed liquid in which silicon dioxide and ion-exchange water were mixed and a second mixed liquid in which a water-soluble polymer and ion-exchange water were mixed were prepared and the second mixed liquid was mixed in the first mixed liquid, and then a basic compound was mixed therein to prepare a third mixed liquid.

During the procedures described above, aggregates (gelated matter) were formed in the third mixed liquids for Comparative Examples 9 and 10, and thus filtration thereof could not be performed. Therefore, the tests for Comparative Examples 9 and 10 were discontinued at this stage. No aggregates (gelated matter) were formed in the third mixed liquids for each of Examples 1 to 17 and Comparative Examples 1 to 8. These results suggest that inclusion of the basic compound in the first mixed liquid is effective to suppress the formation of aggregates (gelated matter) upon mixing the second mixed liquid in the first mixed liquid.

Details of the undiluted polishing compositions and the polishing compositions of Examples 1 to 17 and Comparative Examples 1 to 10 are shown in Table 2. Colloidal silica was used as the silicon dioxide. Hydroxyethyl cellulose (HEC), hydrolyzed hydroxyethyl cellulose (hydrolyzed HEC), a graft polymer of polyvinyl alcohol and polyvinylpyrrolidone (PVA-g-PVP), polyvinyl alcohol (PVA), or cationized polyvinyl alcohol (cationized PVA) was used as the water-soluble polymer. Ammonia was used as the basic compound. Polyoxyethylene polyoxypropylene copolymer (PEO-PPO-PEO) or polyoxyethylene decyl ether (C-PEO) was used as the surfactant. Triammonium citrate or ammonium carbonate was used as the salt. The contents of the surfactant and the salt in each polishing composition are 0.0005% by mass. The average primary particle diameters calculated from the values of the specific areas using "Flow Sorb II 2300" (Micromeritics Instrument Corp.) are shown in the column of particle diameter of silicon dioxide in Table 2.

Then, the concentration of the adsorbate adsorbed on the silicon dioxide in terms of carbon (A) and the total carbon concentration in the polishing composition (B) were determined for each of the polishing compositions of Examples 1 to 17 and Comparative Examples 1 to 8. Specifically, carbon-containing compositions each of which is different from one of the polishing compositions only in absence of silicon dioxide were prepared. The TOC value was determined for each carbon-containing composition using "TOC-5000A" (Shimadzu Corporation) and each determined TOC value was defined as the total carbon concentration (B) for the corresponding polishing composition.

In addition, each of the polishing compositions of Examples 1 to 17 and Comparative Examples 1 to 8 was subjected to centrifugation treatment (20,000 rpm, 30 minutes) to be separated into a precipitate including the silicon dioxide and a supernatant liquid, followed by determination of the TOC value of each supernatant liquid. Then, each concentration of the adsorbate adsorbed on the silicon dioxide in terms of carbon (A) was calculated as the difference between the TOC value for each supernatant liquid and the TOC value for the corresponding carbon-containing composition. Further, each percentage of the concentration of the adsorbate (A) relative to the total carbon concentration in the polishing composition (B) (carbon concentration in the corresponding carbon-containing composition) was calculated. These results are shown in Table 3.

Subsequently, the surface of a silicon substrate after preliminary polishing was polished using each of the polishing compositions of Examples 1 to 17 and Comparative Examples 1 to 8 under the conditions set forth in Table 1. The silicon substrate used in the polishing was provided by preliminary polishing, using polishing slurry (trade name GLANZOX 2100, Fujimi Incorporated), a silicon substrate having a diameter of 200 mm, a conduction type of P type, crystal orientation of <100>, and a resistivity of 0.1 Ω·cm or more and 100 Ω·cm or less, followed by cutting into a 60 mm square chip shape.

The surface of each silicon substrate after polishing was washed with flowing water at a flow rate of 7 L/min for 10 seconds. Each silicon substrate was allowed to stand in a vertical position, and after 30 seconds, the water repelling distance from the corner part of the silicon substrate was measured. These results are shown in Table 3. The water repelling distance is an index for the hydrophilicity of the substrate surface after polishing and the higher the hydrophilicity of the substrate surface is, the smaller the value of the water repelling distance is. The maximum value of the water repelling distance is to be 85 mm, which corresponds to the diagonal of the silicon substrate.

Then, evaluation was performed for ease of cleaning-off (ease of removal) of the water-soluble polymer adsorbed on the surface of each silicon substrate after polishing. The ease of cleaning-off of the water-soluble polymer was evaluated based on the frequency of repetition of cleaning procedure required for the substrate surface to reach a complete water-repellent surface when the silicon substrate imparted with hydrophilicity by the adsorbed water-soluble polymer was subjected to a predetermined cleaning procedure. The predetermined cleaning procedure includes immersing the silicon substrate in a chemical solution (ammonia:hydrogen peroxide:water=1:1:8) at 25° C. for 15 seconds, followed by immersing the substrate in a 3%-hydrogen fluoride aqueous solution at 25° C. for 20 seconds. The case where the frequency of the repetition of the cleaning procedure required for the substrate surface to reach a complete water-repellent surface was once or more and 3 times or less, the case of 4 times or more and 6 times or less, and the case of 7 times or more were evaluated as "A", "B", and "C", respectively. These results are shown in Table 3. With regard to each of Comparative Examples 1 to 8, the water-soluble polymer was not thought to be adsorbed on the surface of the silicon substrate after polishing from the measurement result for the water repelling distance, and therefore the ease of cleaning-off evaluation was not carried out.

TABLE 1

| | |
|---|---|
| Polishing machine | tabletop polishing machine (EJ-380IN, Engis Japan Corporation) |
| Polishing load | 15 kPa |
| Platen rotational frequency | 30 rpm |
| Head rotational frequency | 30 rpm |
| Polishing time | 1 minute |
| Polishing composition temperature | 20° C. |
| Polishing composition feed rate | 0.25 L/min (used without recycling) |

TABLE 2

| | Polishing composition | | | | | | | | Undiluted polishing composition | |
|---|---|---|---|---|---|---|---|---|---|---|
| | Silicon dioxide | | Water-soluble polymer | | | Basic compound | | | | Amount by mole of basic compound per unit surface |
| | Particle diameter [nm] | Concentration [% by mass] | Kind | Weight average molecular weight | Concentration [% by mass] | concentration [% by mass] | Additive | Silicon dioxide concentration [% by mass] | Basic compound concentration [% by mass] | area of silicon dioxide [×10⁻⁶ mol/m²] |
| Example 1 | 35 | 0.46 | HEC | 90000 | 0.010 | 0.012 | — | 9.2 | 0.23 | 18 |
| Example 2 | 35 | 0.46 | HEC | 90000 | 0.020 | 0.012 | — | 9.2 | 0.23 | 18 |
| Example 3 | 35 | 0.46 | HEC | 120000 | 0.003 | 0.012 | — | 9.2 | 0.23 | 18 |
| Example 4 | 35 | 0.46 | HEC | 120000 | 0.009 | 0.012 | — | 9.2 | 0.23 | 18 |
| Example 5 | 35 | 0.46 | HEC | 120000 | 0.018 | 0.012 | — | 9.2 | 0.23 | 18 |
| Example 6 | 35 | 0.46 | HEC | 250000 | 0.005 | 0.012 | — | 9.2 | 0.23 | 18 |
| Example 7 | 35 | 0.46 | HEC | 250000 | 0.018 | 0.012 | — | 9.2 | 0.23 | 18 |
| Example 8 | 35 | 0.46 | HEC | 250000 | 0.032 | 0.012 | — | 9.2 | 0.23 | 18 |
| Example 9 | 35 | 0.46 | HEC | 500000 | 0.018 | 0.012 | — | 9.2 | 0.23 | 18 |
| Example 10 | 35 | 0.24 | HEC | 250000 | 0.009 | 0.006 | — | 9.6 | 0.24 | 17 |
| Example 11 | 35 | 0.13 | HEC | 250000 | 0.008 | 0.004 | — | 2.6 | 0.08 | 17 |
| Example 12 | 25 | 0.46 | Hydrolyzed HEC | 250000 | 0.018 | 0.012 | — | 9.2 | 0.23 | 18 |
| Example 13 | 35 | 0.46 | PVA-g-PVP | 80000 | 0.018 | 0.012 | PEO-PPO-PEO | 9.2 | 0.23 | 18 |
| Example 14 | 35 | 0.46 | HEC | 170000 | 0.018 | 0.012 | C-PEO | 9.2 | 0.23 | 18 |
| Example 15 | 35 | 0.46 | HEC | 250000 | 0.018 | 0.012 | PEO-PPO-PEO Triammonium citrate | 9.2 | 0.23 | 18 |
| Example 16 | 35 | 0.23 | HEC | 250000 | 0.009 | 0.006 | PEO-PPO-PEO Ammonium carbonate | 4.6 | 0.12 | 19 |
| Example 17 | 25 | 0.23 | HEC | 250000 | 0.009 | 0.005 | — | 4.6 | 0.10 | 11 |
| Comparative Example 1 | — | — | HEC | 250000 | 0.060 | — | — | — | — | — |
| Comparative Example 2 | 35 | 0.46 | HEC | 120000 | 0.001 | 0.012 | — | 9.2 | 0.23 | 18 |
| Comparative Example 3 | 35 | 0.46 | HEC | 250000 | 0.001 | 0.012 | — | 9.2 | 0.23 | 18 |
| Comparative Example 4 | 35 | 0.46 | HEC | 500000 | 0.001 | 0.012 | — | 9.2 | 0.23 | 18 |
| Comparative Example 5 | 35 | 0.46 | HEC | 250000 | 0.100 | 0.012 | — | 9.2 | 0.23 | 18 |
| Comparative Example 6 | 35 | 0.46 | Cationized PVA | 26000 | 0.018 | 0.012 | — | 9.2 | 0.34 | 26 |
| Comparative Example 7 | 35 | 0.46 | PVA | 75000 | 0.008 | 0.012 | — | 9.2 | 0.23 | 18 |
| Comparative Example 8 | 35 | — | — | — | — | — | — | 9.2 | — | — |
| Comparative Example 9 | 35 | — | HEC | 250000 | — | — | — | — | — | — |
| Comparative Example 10 | 35 | — | HEC | 500000 | — | — | — | 9.2 | 0.23 | 18 |

TABLE 3

|  | Adsorbate concentration in terms of carbon (A) [ppm by mass] | Total carbon concentration (B) [ppm by mass] | A/B [%] | Water repelling distance [mm] | Ease of cleaning-off |
|---|---|---|---|---|---|
| Example 1 | 16.3 | 28.6 | 57.0 | 5 | A |
| Example 2 | 30.2 | 79.1 | 38.2 | 10 | A |
| Example 3 | 5.5 | 10.1 | 54.4 | 45 | A |
| Example 4 | 10.9 | 34.2 | 31.9 | 5 | A |
| Example 5 | 14.0 | 72.5 | 19.3 | 10 | A |
| Example 6 | 17.4 | 24.3 | 71.3 | 40 | A |
| Example 7 | 45.9 | 87.7 | 52.3 | 5 | B |
| Example 8 | 57.0 | 153.4 | 37.2 | 15 | B |
| Example 9 | 45.0 | 74.5 | 60.4 | 1 | C |
| Example 10 | 49.3 | 87.7 | 56.2 | 10 | B |
| Example 11 | 19.0 | 30.2 | 63.0 | 5 | B |
| Example 12 | 25.6 | 41.6 | 61.5 | 10 | A |
| Example 13 | 51.9 | 102.2 | 50.8 | 25 | A |
| Example 14 | 47.3 | 87.7 | 54.0 | 15 | A |
| Example 15 | 52.6 | 87.7 | 60.0 | 5 | B |
| Example 16 | 24.1 | 43.8 | 55.0 | 5 | B |
| Example 17 | 21.8 | 36.3 | 60.0 | 5 | B |
| Comparative Example 1 | 0.0 | 292.2 | 0.0 | 85 | — |
| Comparative Example 2 | 0.4 | 2.0 | 18.1 | 85 | — |
| Comparative Example 3 | 0.7 | 2.4 | 29.7 | 85 | — |
| Comparative Example 4 | 3.0 | 4.9 | 61.8 | 85 | — |
| Comparative Example 5 | 0.8 | 2.1 | 37.6 | 85 | — |
| Comparative Example 6 | 57.0 | 487.0 | 11.7 | 80 | — |
| Comparative Example 7 | 12.7 | 88.7 | 14.3 | 85 | — |
| Comparative Example 8 | 0.0 | 785.9 | 0.0 | 65 | — |

As shown in Table 3, when the polishing composition of Comparative Example 1 was used in which silicon dioxide was not contained, the substrate surface, which exhibited a water repelling distance of 85 mm, was not imparted with hydrophilicity. On the other hand, when each of the polishing compositions of Examples 1 to 17 was used in which silicon dioxide was contained and the concentration of the adsorbate adsorbed on the silicon dioxide in terms of carbon (A) and the percentage of the concentration of the adsorbate in terms of carbon relative to the total carbon concentration in the polishing composition (A/B) were in the specific ranges, respectively, the substrate surface, which exhibited a water repelling distance of 45 mm or less, was found to be imparted with high hydrophilicity. Additionally, the more the molecular weight of the water-soluble polymer was decreased, the higher the ease of cleaning-off tended to be evaluated.

Further, when each of the polishing compositions of Comparative Examples 2 to 8 was used in which at least either of the concentration of the adsorbate adsorbed on the silicon dioxide in terms of carbon (A) and the percentage of the concentration of the adsorbate in terms of carbon relative to the total carbon concentration in the polishing composition (A/B) was out of the specific ranges, the substrate surface was not imparted with hydrophilicity, or even when imparted, was imparted with slight hydrophilicity.

The invention claimed is:

1. A method for producing a polishing composition, the method comprising:
    preparing an undiluted polishing composition containing silicon dioxide and a water-soluble polymer including carbon; and
    diluting the undiluted polishing composition with water or a basic aqueous solution to obtain a polishing composition in which at least part of the water-soluble polymer is adsorbed on the silicon dioxide, wherein the concentration of the water-soluble polymer adsorbed on the silicon dioxide is 4 ppm or more by mass in terms of carbon and a percentage of the concentration of the water-soluble polymer adsorbed on the silicon dioxide in terms of carbon relative to the total concentration of all the water-soluble polymer in the polishing composition is 15% or more in terms of carbon,
    wherein the preparing an undiluted polishing composition includes mixing silicon dioxide with a basic compound to obtain a first mixture, mixing a water-soluble polymer with the first mixture to obtain a second mixture, and then filtering the second mixture.

2. The method according to claim 1, wherein the silicon dioxide is contained in the undiluted polishing composition in an amount of 1% by mass or more and 20% by mass or less, and wherein the basic compound is contained in the undiluted polishing composition in an amount of 0.01% by mass or more and 1% by mass or less.

3. The method according to claim 1, wherein an amount by mole of the basic compound per unit surface area of the silicon dioxide is $8.5 \times 10^{-6}$ mol/m$^2$ or more in the undiluted polishing composition.

4. The method according to claim 1, wherein the water-soluble polymer includes a cellulose derivative, polyvinylpyrrolidone, or a copolymer containing polyvinylpyrrolidone.

5. The method according to claim 4, wherein the silicon dioxide is colloidal silica.

6. The method according to claim 1, wherein the silicon dioxide is colloidal silica.

* * * * *